United States Patent
Weng

(10) Patent No.: US 8,110,842 B2
(45) Date of Patent: Feb. 7, 2012

(54) LIGHT-EMITTING DIODE MODULE AND MANUFACTURING METHOD THEREOF

(75) Inventor: Ssu-Yuan Weng, Tu Chen (TW)

(73) Assignee: Everlight Electronics Co., Ltd., New Taipei (TW)

(*) Notice: Subject to any disclaimer, the term of this patent is extended or adjusted under 35 U.S.C. 154(b) by 878 days.

(21) Appl. No.: 11/827,475

(22) Filed: Jul. 12, 2007

(65) Prior Publication Data

US 2008/0283856 A1   Nov. 20, 2008

(30) Foreign Application Priority Data

May 18, 2007   (TW) ................................ 96117895 A

(51) Int. Cl.
*H01L 33/00*   (2010.01)

(52) U.S. Cl. .................. 257/98; 257/99; 257/E33.068; 257/E31.127; 438/22; 438/27; 438/25; 438/26; 438/465

(58) Field of Classification Search .............. 438/22, 438/25, 26, 27, 29; 257/98, 99, E33.068, 257/E31.127
See application file for complete search history.

(56) References Cited

U.S. PATENT DOCUMENTS

| | | | | |
|---|---|---|---|---|
| 2002/0006040 | A1* | 1/2002 | Kamada et al. | 362/237 |
| 2002/0028527 | A1* | 3/2002 | Maeda et al. | 438/29 |
| 2005/0186760 | A1 | 8/2005 | Hashimura et al. | |
| 2005/0207165 | A1* | 9/2005 | Shimizu et al. | 362/362 |
| 2006/0279949 | A1 | 12/2006 | Shin et al. | |
| 2008/0265448 | A1* | 10/2008 | Ashida | 264/1.1 |
| 2009/0302344 | A1* | 12/2009 | Inoguchi | 257/98 |

FOREIGN PATENT DOCUMENTS

| | | |
|---|---|---|
| CN | 1484328 A | 3/2004 |
| JP | 56135984 | 10/1981 |
| JP | 2000269555 A | 9/2000 |
| JP | 2002-324917 A | 11/2002 |
| JP | 2003008065 A | 1/2003 |
| JP | 2004119981 A | 4/2004 |
| JP | 2005116817 A | 4/2005 |
| JP | 2006106479 A | 4/2006 |
| JP | 2006210880 A | 8/2006 |
| JP | 2007073825 A | 3/2007 |
| JP | 2007159256 A | 6/2007 |
| JP | 2008288540 A | 11/2008 |
| TW | M261835 | 4/2005 |
| TW | M279014 | 10/2005 |
| TW | I274657 | 3/2007 |

* cited by examiner

*Primary Examiner* — Cuong Q Nguyen
*Assistant Examiner* — Cathy N Lam
(74) *Attorney, Agent, or Firm* — Han IP Law PLLC; Andy M. Han

(57) ABSTRACT

A method for manufacturing a light-emitting diode (LED) module is provided. Plural LED package structures are formed on a substrate first. A space is located between two adjacent LED package structures. A Lens laminated plate is subsequently bonded onto the LED package structures. The lens laminated plate includes plural lenses, and each lens is located right above a LED of each LED package structure. Finally, plural LED modules are formed by cutting the substrate along the space. A LED module structure is also disclosed.

18 Claims, 3 Drawing Sheets

LIGHT-EMITTING DIODE MODULE AND MANUFACTURING METHOD THEREOF

RELATED APPLICATIONS

This application claims priority to Taiwan Application Serial Number 96117895, filed May 18, 2007, which is herein incorporated by reference.

BACKGROUND

1. Field of Invention

The present invention relates to a light-emitting diode module and the manufacturing method thereof. More particularly, the present invention relates to a light-emitting diode module having a lens and the manufacturing method thereof.

2. Description of Related Art

Light-emitting diode (LED) module is gradually used in various illuminating products and backlight of liquid crystal display, because it is featured by low power consumption, low driving voltage, long lifetime and environment-friendly characteristic. A lens is normally assembled right above a light-emitting diode of the LED module to modify the path of the light generated from the light-emitting diode.

FIG. 1 shows a cross-sectional view of a conventional LED module. The LED module 100 includes a substrate 110, a LED package structure 120 and a cover-like lens 130. The cover-like lens 130 of the LED module 100 is conventionally assembled in the LED module 100 in another production line after each LED package structure 120 is formed and cut in the cutting process. The conventional lens assembling process mentioned above should be completed by additional labor and process, and the manufacturing cost of each LED module 100 is thus increased.

SUMMARY

A method for manufacturing a light-emitting diode module is provided. Plural light-emitting diode (LED) package structures are formed on a substrate. A space is located between two adjacent LED package structures. Each LED package structure includes a package cup, a light-emitting diode and a transparent resin. The light-emitting diode is located in the package cup. The transparent resin covers the light-emitting diode. A lens laminated plate having plural lenses is subsequently bonded onto the LED package structures. Each lens is located right above the light-emitting diode of each of the LED package structures. Finally, plural LED modules are formed by cutting the substrate along the space.

A LED module is provided. The LED module includes a LED package structure and a lens. The LED package structure is located on a substrate and includes a package cup, a light-emitting diode and a transparent resin. The light-emitting diode is located in the package cup. The transparent resin covers the light-emitting diode. The lens is bonded on the transparent resin.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 2A:
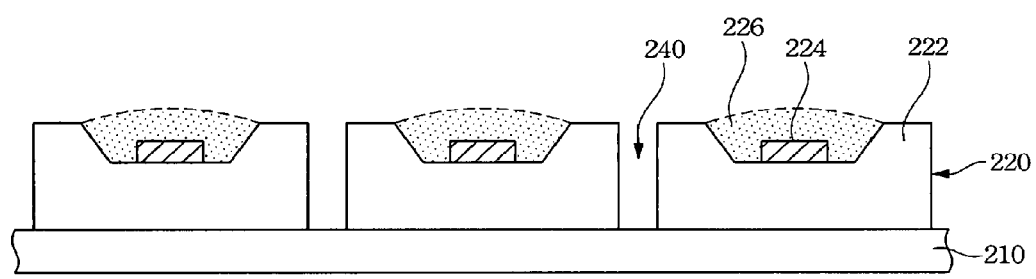
FIGS. 2A~2C shows a cross-sectional view of a manufacturing process of a light-emitting diode module according to one embodiment of the present invention.
Figure 2B:
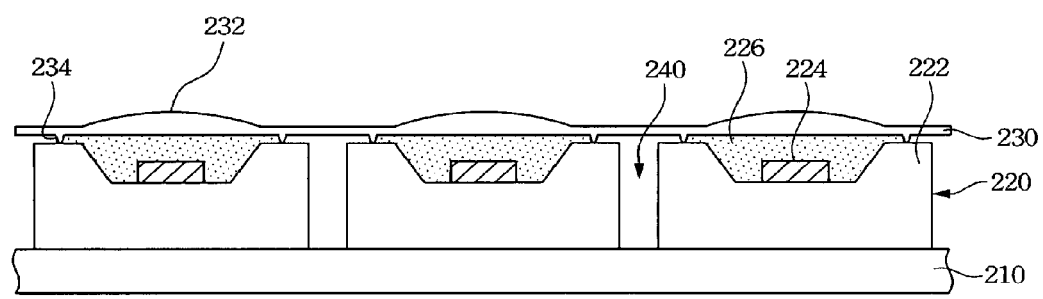
Figure 2C:
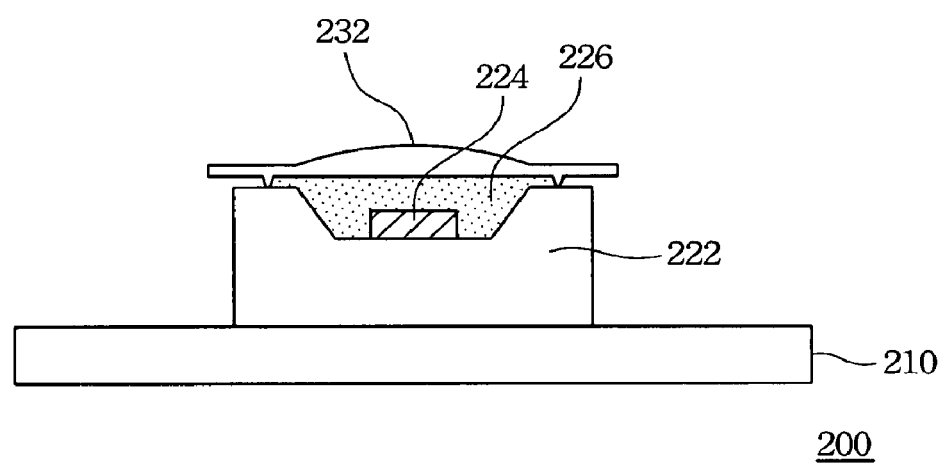

FIGS. 2A~2C shows a cross-sectional view of a manufacturing process of a light-emitting diode module according to one embodiment of the present invention. Referring to FIG. 2A, plural light-emitting diode (LED) package structures 220 are formed on a substrate 210. A space 240 is located between two adjacent LED package structures 220. Each LED package structure 220 includes a package cup 222, a light-emitting diode 224 and a transparent resin 226. The light-emitting diode 224 is located in the package cup 222. The transparent resin 226 covers the light-emitting diode 224.

The substrate 210 can be a circuit board. The light-emitting diode 224 can be substantially composed of gallium nitride, gallium arsenide or gallium phosphide. The light-emitting diode 224 is first formed in the package cup 222 by any practicable method like crystallization method. A transparent resin 226 is subsequently filled into the package cup 222 to cover the light-emitting diode 224. The conventional wire package process such as die bond process and wire bond process can be carried out before filling the transparent resin 226 into the package cup 222.

Referring to FIG. 2B, a lens laminated plate 230 having plural lenses 232 is subsequently bonded onto the LED package structures 220 after the LED package structures 220 are formed. Each lens 232 is located right above the light-emitting diode 224 of each LED package structure 220. The lens 232 normally applied for the LED package structure 220 such as Fresnel lens, Micro lens or Ball lens can be used to modify the light path of the light emitted from the LED package structure 220. The lens 232 and the lens laminated plate 230 can be made of same material such as glass or plastic (e.g. epoxy).

Referring to FIG. 2B, a surface of the lens laminated plate 230 facing the LED package structure 220 has plural protrusions 234 used for adjusting the distance between the light-emitting diode 224 and the lens 232 to satisfy different photo design requirement. By designing a particular mold used for manufacturing lens laminated plate 230, the protrusion 234 can be simultaneously formed on the lens laminated plate 230 when the lens laminated plate 230 is molded. The forming method of the protrusion 234 is not limited to the description given above.

A curing reaction of the transparent resin 226 is carried out after the lens laminated plate 230 is bonded onto the LED package structures 220, to solidify the transparent resin 226 and further make the lens laminated plate 230 and the transparent resin 226 tightly cohered. The transparent resin 226 can be an epoxy resin. The curing reaction of the epoxy resin is carried out with heating and the curing temperature is about 150° C. Besides, the lens laminated plate 230 also can be adhered to the solidified transparent resin or uncured transparent resin by forming a transparent adhesive on the surface of the lens laminated plate 230 bonded to the LED package structures 220.

Referring to FIG. 2B again, the transparent resin 226 can be slightly higher than the package cup 222. The transparent resin 226 can flow to a gap between the package cup 222 and the lens laminated plate 230 when the lens laminated plate 230 is bonded onto the LED package structures 220. It further provides a larger adhesion area. The adhesion between the lens laminated plate 230 and the LED package structures 220 can be improved due to the larger adhesion area. Besides, it also can avoid bubble produced in the gap between the package cup 222 and the lens laminated plate 230 when the lens laminated plate 230 is bonded onto the LED package structures 220.

Plural LED modules 200 shown in FIG. 2C are subsequently formed by cutting the substrate 210 along the space 240, after the lens laminated plate 230 is bonded onto the LED package structures 220 and the transparent resin 226 is solidified.

Figure 1:
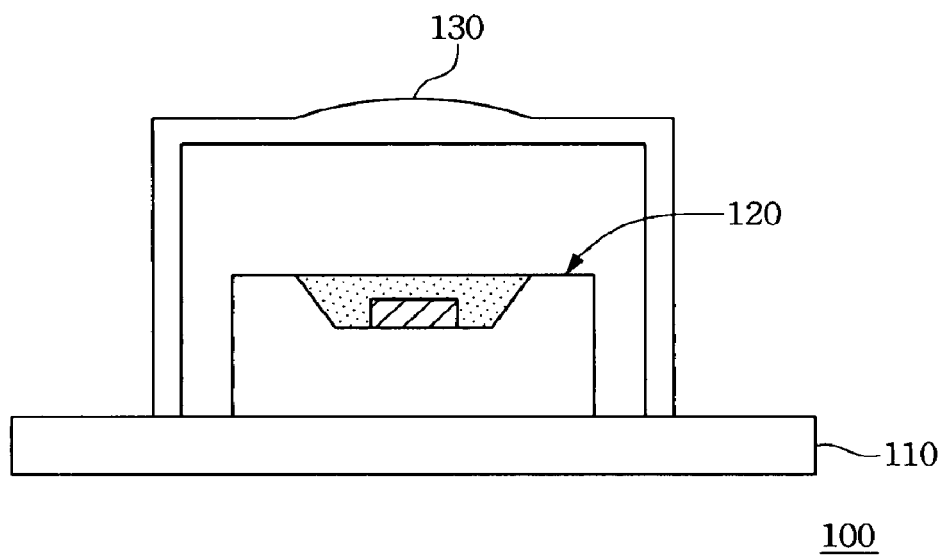
FIG. 1 is a cross-sectional view of a conventional light-emitting diode module.

According to the manufacturing method of the LED module 200 given above, it does not require another production line to assemble each lens 232 on each LED package structure 220. Therefore, the manufacturing cost of each LED module 200 is further reduced. Besides, the size of the LED module 200 according to the embodiment of the present invention and shown in FIG. 2C is comparatively smaller than the conventional LED module 100 shown in FIG. 1.

Although the present invention has been described in considerable detail with reference to certain embodiments thereof, other embodiments are possible. Therefore, their spirit and scope of the appended claims should no be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for manufacturing a plurality of light-emitting diode modules, comprising:
   forming a plurality of light-emitting diode package structures on a substrate such that a space is located between two adjacent ones of the light-emitting diode package structures, each of the light-emitting diode package structures respectively comprising:
      a package cup;
      a light-emitting diode located in the package cup; and
      a transparent resin covering the light-emitting diode;
   bonding a lens laminated plate having a plurality of lenses on a first primary side of the lens laminated plate onto the light-emitting diode package structures, each of the lenses disposed above the light-emitting diode of a respective one of the light-emitting diode package structures, the lens laminated plate having a plurality of protrusions extending from a second primary side that is opposite the first primary side and facing the light-emitting diode package structures, each of the protrusions corresponding to a respective one of the lenses, the protrusions providing a distance between the lenses and the light-emitting diode package structure wherein the protrusions having the same material with the lenses; and
   cutting the substrate along the space to form the plurality of light-emitting diode modules.

2. The light-emitting diode module manufacturing method of claim 1, further comprising forming plural protrusions on a surface of the lens laminated plate, facing the light-emitting diode package structure, prior to cutting the substrate along the space to form the plurality of light-emitting diode modules.

3. The light-emitting diode module manufacturing method of claim 1, wherein each light-emitting diode package structure forming method comprises:
   forming the light-emitting diode in the package cup; and
   filling the transparent resin into the package cup to cover the light-emitting diode.

4. The light-emitting diode module manufacturing method of claim 3, further comprising carrying out a curing reaction of the transparent resin after the lens laminated plate is bonded onto the light-emitting diode package structures.

5. The light-emitting diode module manufacturing method of claim 4, wherein the transparent resin is an epoxy resin and the curing temperature thereof is about 150° C.

6. The light-emitting diode module manufacturing method of claim 3, wherein the transparent resin is slightly higher than the package cup, so that the transparent resin flows to a gap between the package cup and the lens laminated plate when the lens laminated plate is bonded onto the light-emitting diode package structures.

7. The light-emitting diode module manufacturing method of claim 1, further comprising forming a transparent adhesive on a surface of the lens laminated plate, bonded to the light-emitting diode package structures, so that the lens laminated plate being tightly adhered to the light-emitting diode package structures.

8. The light-emitting diode module manufacturing method of claim 1, wherein the lens laminated plate is composed of plastic or glass.

9. The light-emitting diode module manufacturing method of claim 1, wherein the substrate is a circuit board.

10. A method for manufacturing a plurality of light-emitting diode modules, comprising:
   providing a substrate;
   forming a plurality of light-emitting diode package structures on the substrate, wherein each of the light-emitting diode package structures comprises a package cup, a light-emitting diode located in the package cup, and a transparent resin covering the light-emitting diode, wherein a space is located between the package cups of two adjacent ones of the light-emitting diode package structures and exposes part of the substrate;
   providing a lens laminated plate having a first primary side and a second primary side opposite the first primary side, the lens laminated plate including a plurality of lenses formed on the first primary side and further including a plurality of protrusions extending from the second primary side;
   bonding the lens laminated plate onto the light-emitting diode package structures with the second primary side of the lens laminated plate facing the light-emitting diode package structures such that the protrusions provide a distance between the second primary side of the lens laminated plate and the light-emitting diode package structures wherein the protrusions having the same material with the lenses, wherein each of the lenses aligns with and corresponds to the light-emitting diode of a respective one of the light-emitting diode package structures; and
   cutting the exposed part of the substrate along the space to form the plurality of light-emitting diode modules.

11. The light-emitting diode module manufacturing method of claim 10, further comprising forming plural protrusions on a surface of the lens laminated plate, facing the light-emitting diode package structure, prior to cutting the substrate along the space to form the plurality of light-emitting diode modules.

12. The light-emitting diode module manufacturing method of claim 10, wherein, for each light-emitting diode package structure, the method further comprises:
   forming the light-emitting diode in the package cup; and filling the transparent resin into the package cup to cover the light-emitting diode.

13. The light-emitting diode module manufacturing method of claim 12, further comprising carrying out a curing reaction of the transparent resin after the lens laminated plate is bonded onto the light-emitting diode package structures.

14. The light-emitting diode module manufacturing method of claim 13, wherein the transparent resin is an epoxy resin and the curing temperature thereof is about 150° C.

15. The light-emitting diode module manufacturing method of claim 12, wherein the transparent resin is slightly higher than the package cup such that the transparent resin flows to a gap between the package cup and the lens laminated plate when the lens laminated plate is bonded onto the light-emitting diode package structures.

16. The light-emitting diode module manufacturing method of claim 10, further comprising forming a transparent adhesive on a surface of the lens laminated plate, bonded to the light-emitting diode package structures such that the lens laminated plate is tightly adhered to the light-emitting diode package structures.

17. The light-emitting diode module manufacturing method of claim 10, wherein the lens laminated plate is composed of plastic or glass.

18. The light-emitting diode module manufacturing method of claim 10, wherein the substrate is a circuit board.

* * * * *